United States Patent
Mochizuki

(10) Patent No.: US 12,065,567 B2
(45) Date of Patent: Aug. 20, 2024

(54) METHOD OF MANUFACTURING SILICONE CURED PRODUCT, SILICONE CURED PRODUCT AND OPTICAL MEMBER

(71) Applicant: MOMENTIVE PERFORMANCE MATERIALS JAPAN LLC, Tokyo (JP)

(72) Inventor: Kikuo Mochizuki, Tokyo (JP)

(73) Assignee: MOMENTIVE PERFORMANCE MATERIALS JAPAN LLC, Tokyo (JP)

( * ) Notice: Subject to any disclaimer, the term of this patent is extended or adjusted under 35 U.S.C. 154(b) by 718 days.

(21) Appl. No.: 17/118,864

(22) Filed: Dec. 11, 2020

(65) Prior Publication Data

US 2021/0095126 A1    Apr. 1, 2021

Related U.S. Application Data

(63) Continuation of application No. PCT/JP2019/023069, filed on Jun. 11, 2019.

(30) Foreign Application Priority Data

Jun. 12, 2018 (JP) ................. 2018-111811

(51) Int. Cl.

| | | |
|---|---|---|
| C08L 83/04 | (2006.01) | |
| C08G 77/12 | (2006.01) | |
| C08G 77/18 | (2006.01) | |
| C08G 77/20 | (2006.01) | |
| F21V 3/06 | (2018.01) | |
| H01L 23/29 | (2006.01) | |
| B29D 11/00 | (2006.01) | |

(52) U.S. Cl.
CPC .............. *C08L 83/04* (2013.01); *C08G 77/12* (2013.01); *C08G 77/18* (2013.01); *C08G 77/20* (2013.01); *F21V 3/062* (2018.02); *H01L 23/296* (2013.01); *B29D 11/00009* (2013.01); *C08L 2205/025* (2013.01); *C08L 2205/03* (2013.01)

(58) Field of Classification Search
CPC ........ C08G 77/12; C08G 77/20; C08G 77/18; C08L 83/04; C09D 183/04; H01L 33/56; H01L 23/296

See application file for complete search history.

(56) References Cited

U.S. PATENT DOCUMENTS

| | | | |
|---|---|---|---|
| 2006/0081864 A1* | 4/2006 | Nakazawa | C09D 183/04 257/E33.059 |
| 2007/0197742 A1 | 8/2007 | Yamakawa | |
| 2007/0244214 A1 | 10/2007 | Yoshitake et al. | |
| 2008/0033120 A1 | 2/2008 | Yoshitake et al. | |
| 2008/0249244 A1 | 10/2008 | Meguriya | |
| 2009/0075009 A1* | 3/2009 | Fujisawa | C08L 83/04 525/100 |
| 2010/0280210 A1 | 11/2010 | Kitamura et al. | |
| 2016/0251482 A1 | 9/2016 | Yamazaki et al. | |
| 2017/0114220 A1* | 4/2017 | Kusunoki | C08L 83/06 |
| 2017/0283613 A1 | 10/2017 | Mochizuki | |
| 2017/0283614 A1 | 10/2017 | Mochizuki | |
| 2018/0346722 A1 | 12/2018 | Shudo | |

FOREIGN PATENT DOCUMENTS

| | | | |
|---|---|---|---|
| CN | 1890324 A | | 1/2007 |
| CN | 1894600 A | | 1/2007 |
| CN | 101070429 A | | 11/2007 |
| CN | 101848957 A | | 9/2010 |
| CN | 105924974 A | | 9/2016 |
| CN | 107001803 A | | 8/2017 |
| JP | H06-329803 A | | 11/1994 |
| JP | 10-231428 A | * | 9/1998 |
| JP | 2002309090 | * | 10/2002 |
| JP | 2008-255227 A | | 10/2008 |
| JP | 2009-185257 A | | 8/2009 |
| JP | 2012-144607 A | | 8/2012 |
| JP | 2017-105930 A | | 6/2017 |
| WO | WO-2014/105974 | | 7/2014 |
| WO | WO-2016-098884 A1 | | 6/2016 |

OTHER PUBLICATIONS

JP 2002 309090 machine translation (2002).*
Office Action issued in corresponding Chinese Patent Application No. 201980039234.8, dated Jul. 15, 2022 (19 pages).
European Search Report for EP Appl. Ser. No. 19819090.2 mailed Feb. 4, 2022 (8 pages).
Office Action issued in corresponding Chinese Patent Application No. 201980039234.8, with English Machine Translation dated Dec. 12, 2022 (17 pages).
Office Action issued in corresponding Taiwanese Patent Application No. 108120235, with English Machine Translation dated Dec. 15, 2022 (16 pages).
Office Action issued in corresponding Chinese Patent Application No. 201980039234.8 dated Mar. 24, 2023 (16 pages).

* cited by examiner

*Primary Examiner* — Marc S Zimmer
(74) *Attorney, Agent, or Firm* — Foley & Lardner LLP

(57) ABSTRACT

To provide a method of manufacturing a silicone cured product and a silicone cured product which allow generation of a volatile component to be reduced significantly even being exposed to high temperatures of room temperature or more for a long time. A method of manufacturing a silicone cured product includes: curing an additional polyorganosiloxane composition by hydrosilylation reaction under closed atmosphere at a temperature of 40° C. or more and 200° C. or less to obtain a primary cured product; and heating the primary cured product under open atmosphere or reduced pressure at a temperature of 60° C. or more and 160° C. or less, and a silicone cured product in which when heated at 150° C. for 16 hours, a total generation amount of an alcohol having 1 to 3 carbon atoms and an oxide thereof, and an alkyl group-containing silane compound having 1 to 3 carbon atoms is 10 ppm or less.

13 Claims, No Drawings

METHOD OF MANUFACTURING SILICONE CURED PRODUCT, SILICONE CURED PRODUCT AND OPTICAL MEMBER

CROSS-REFERENCE TO RELATED ALLOCATIONS

This application is a continuation of prior International Application No. PCT/JP2019/023069, filed Jun. 11, 2019 which is based upon and claims the benefit of priority from Japanese Patent Application No. 2018-111811, filed Jun. 12, 2018; the entire contents of all of which are incorporated herein by reference.

FIELD

The present invention relates to a method of manufacturing a silicone cured product, a silicone cured product and an optical member.

BACKGROUND

Conventionally, a polyorganosiloxane composition which is cured into silicone rubber has been well known, and by utilizing excellent properties thereof, such as weather resistance, heat resistance, electrical insulation, hardness, mechanical strength, and elongation, it is widely used for a potting material, a coating material, a molding material for blocking, injection molding, and the like, a covering material, and the like in each field of an electrical and electronic field, optics and optoelectronics, a sensor, architecture, and the like. Above all, an additional polyorganosiloxane composition which is cured by an additional reaction is cured rapidly by appropriate heating and a corrosive substance and the like are not emitted at a time of the curing, so that a use in each of the aforesaid fields spreads.

However, it has been known that silicone rubber obtained from such an additional polyorganosiloxane composition contains a low-molecular siloxane having a low polymerization degree, for example, 20 or less, and not having a reactive group such as a hydrosilyl group or an alkenyl group in a molecule, which slightly volatilizes from a silicone cured product even in a state of room temperature and adheres to the circumference to thereby cause various problems. Therefore, after curing the additional polyorganosiloxane composition, for example, by heat treating it at a high temperature of about 200° C., a removal of the low-molecular siloxane has been performed in general. Further, there also have been known techniques of using an additional polyorganosiloxane composition containing components after removing the low-molecular siloxane (for example, refer to JP-A 2008-255227, JP-A 2009-185257) and suppressing the volatilization of the low-molecular siloxane by a method of reducing an amount of silanol group-containing siloxane in the composition (for example, refer to JP-A 2017-105930).

SUMMARY

However, it has been found that in a case where even the silicone cured product obtained after removing the low-molecular siloxane by the conventional method is exposed to high temperatures equal to or higher than room temperature, for example, temperatures of 80° C. to 150° C. for a long time, a volatile component is generated from the cured product.

This embodiment was made in order to solve the above problem, and has an object to provide a method of manufacturing a silicone cured product and a silicone cured product which allow the generation of the volatile component from the cured product to be reduced significantly even in the case of being exposed to high temperatures equal to or higher than room temperature for a long time.

A method of manufacturing a silicone cured product of this embodiment includes: a curing step of curing an additional polyorganosiloxane composition by hydrosilylation reaction under closed atmosphere at a temperature of not lower than 40° C. nor higher than 200° C. to obtain a primary cured product; and a heating step of heating the primary cured product under open atmosphere or reduced pressure at a temperature of not lower than 60° C. nor higher than 160° C.

In the method of manufacturing the silicone cured product of this embodiment, as the additional polyorganosiloxane composition, for example, an additional polyorganosiloxane composition having an alkoxy group having 1 to 3 carbon atoms is used.

Preferably, the additional polyorganosiloxane composition includes: (A) a polyorganosiloxane mixture composed of 50 to 100 mass % of (A1) a straight-chain polyorganosiloxane having two or more alkenyl groups on average in one molecule and 50 to 0 mass % of (A2) a resinoid polyorganosiloxane having 1.5 or more alkenyl groups on average in one molecule; (B) a polyorganohydrogensiloxane containing 5 mmol/g or more of a hydrogen atom bonded to a silicon atom (hereinafter, also indicated as "Si—H".) in an amount in which a molar ratio of the Si—H to the alkenyl group of the component (A)(the number of moles of the Si—H/the number of moles of the alkenyl group) is 1.0 to 3.0; and (C) a hydrosilylation reaction catalyst, and at least one of the (A) polyorganosiloxane mixture and the (B) the polyorganohydrogensiloxane has an alkoxy group having 1 to 3 carbon atoms.

In a silicone cured product of this embodiment, when heated at 150° C. for 16 hours, a total generation amount of an alcohol having 1 to 3 carbon atoms and an oxide thereof, and an alkyl group-containing silane compound having 1 to 3 carbon atoms is 10 ppm or less. Preferably, the silicone cured product of this embodiment is a silicone cured product obtained by the above-described method of manufacturing the silicone cured product of this embodiment.

An optical member of this embodiment is characterized by being composed of the silicone cured product of this embodiment.

According to a method of manufacturing a silicone cured product of this embodiment, it is possible to obtain a silicone cured product in which generation of a volatile component from the cured product is reduced significantly even in a case of being exposed to high temperatures equal to or higher than room temperature for a long time. In a silicone cured product of this embodiment, generation of a volatile component from the cured product is significantly small even in a case of being exposed to high temperatures equal to or higher than room temperature for a long time.

According to an optical member of this embodiment it is possible to suppress adhesion of a volatile component to the optical member since generation of the volatile component from the cured product can be reduced significantly even in a case of being exposed to high temperatures equal to or higher than room temperature for a long time.

DETAILED DESCRIPTION

[Method of Manufacturing Silicone Cured Product]

A method of manufacturing a silicone cured product of an embodiment of this embodiment has the following curing step and heating step.

A curing step: a step of curing an additional polyorganosiloxane composition by hydrosilylation reaction under closed atmosphere at a temperature of not lower than 40° C. nor higher than 200° C. to obtain a primary cured product A heating step: a step of heating the primary cured product under open atmosphere or reduced pressure at a temperature of not lower than 60° C. nor higher than 160° C.

The method of manufacturing the silicone cured product of this embodiment may have a step other than the above-described curing step and heating step as necessary.

The method of manufacturing the silicone cured product of this embodiment preferably further has a solvent contact step of bringing the above-described primary cured product into contact with a solvent after the above-described curing step, for example.

The method of manufacturing the silicone cured product of this embodiment preferably has no step of high-temperature heating exceeding 160° C. after the above-described heating step, in particular, preferably has the above-described heating step as the final step.

The present inventors have considered that a cause in which a silicone cured product obtained by a conventional method, in particular, by curing the additional polyorganosiloxane composition by the hydrosilylation reaction in a sealed state using a metal mold or the like generates a volatile component in high-temperature use thereafter is attributed to the fact that a functional group contained in the additional polyorganosiloxane composition remains as it is or after being transformed in the cured product. For example, they have considered that an unreacted alkenyl group and a low-molecular compound derived from it to be produced, or a low-molecular alkoxy group which the additional polyorganosiloxane composition contains while being derived from its production raw materials, typically, an alkoxy group having 1 to 3 carbon atoms and a low-molecular compound derived from it to be produced, serve as a cause of generation of the volatile component.

For example, it has been found that by curing the additional polyorganosiloxane composition having an alkoxy group having 1 to 3 carbon atoms by the hydrosilylation reaction under closed atmosphere, a primary cured product containing a compound having an alkoxy group having 1 to 3 carbon atoms and/or having an alkyl group having 1 to 3 carbon atoms derived from the alkoxy group can be obtained.

Thus, this embodiment has resulted in that by heating the cured product of the additional polyorganosiloxane composition obtained by the conventional method, in particular, by being cured in the sealed state using the metal mold or the like, namely, the primary cured product in this embodiment, under open atmosphere or reduced pressure under a temperature condition of not lower than 60° C. nor higher than 160° C., a residual functional group and a low-molecular compound derived from it to be produced, typically, the alkoxy group having 1 to 3 carbon atoms and the low-molecular compound derived from it, in the primary cured product, are removed. Then, it has been possible to significantly reduce the generation of the volatile component at the time of high-temperature use in the silicone cured product obtained by the method of this embodiment in such a manner as above.

Incidentally, the volatile component generated by using, at high temperatures, the primary cured product containing the functional group remaining from the additional polyorganosiloxane composition, typically, an alkenyl group, an alkoxy group having 1 to 3 carbon atoms, and a low-molecular compound derived from them is mainly an alcohol having 1 to 3 carbon atoms, an oxide thereof and an alkyl group-containing silane compound having 1 to 3 carbon atoms. There can be cited methanol, ethanol, n-propanol and isopropanol as the alcohol having 1 to 3 carbon atoms. The oxide of the alcohol having 1 to 3 carbon atoms is aldehyde having 1 to 3 carbon atoms, a carboxylic acid or ketone, and specifically, an acetic acid or the like can be cited.

Further, the silane compound containing an alkyl group having 1 to 3 carbon atoms is alkylsilane or alkylsilanol in which an alkyl group having 1 to 3 carbon atoms is bonded to a silicon atom, alkoxysilane in which an alkoxy group having 1 to 3 carbon atoms is bonded to a silicon atom, alkylalkoxysilane in which an alkyl group having 1 to 3 carbon atoms and an alkoxy group having 1 to 3 carbon atoms are bonded to a silicon atom, or the like. An alkoxy group is a group in which —O— is bonded to an alkyl group, and an alkoxy group having 1 to 3 carbon atoms is included in a group having an alkyl group having 1 to 3 carbon atoms. The alkyl group-containing silane compound having 1 to 3 carbon atoms may have a plurality of alkyl groups each having 1 to 3 carbon atoms. As the alkyl group-containing silane compound having 1 to 3 carbon atoms, for example, there can be cited trimethylsilane, tetramethylsilane, trimethylsilanol, trimethylethoxysilane, trimethylsilane acetate, or the like.

The silicone cured product obtained by the method of this embodiment hardly generates a volatile component gas from the silicone cured product even in a case of being exposed to high temperatures equal to or higher than room temperature for a long time. In the silicone cured product obtained by the of this embodiment, for example, when heated at 150° C. for 16 hours, it is possible to set the total generation amount of the alcohol having 1 to 3 carbon atoms and the oxide thereof, and the alkyl group-containing silane compound having 1 to 3 carbon atoms to 10 ppm or less. The alcohol having 1 to 3 carbon atoms and the oxide thereof, and the alkyl group-containing silane compound having 1 to 3 carbon atoms are hereinafter also referred to a volatile component (Y). The total generation amount of the volatile component (Y) when heated at 150° C. for 16 hours is hereinafter also simply referred to "the total generation amount of the volatile component (Y)". In the method of this embodiment, the total generation amount of the volatile component (Y) of the obtained silicone cured product is preferably 8 ppm or less, and more preferably 1 ppm or less.

The total generation amount of the volatile component (Y) can be obtained by measuring the total amount of the volatile component (Y) in a generated gas when a 2 to 3 g silicone cured product cut into a 2 to 5 mm square is heated at 150° C. for 16 hours and converting the total amount into a mass concentration per unit mass of the silicone cured product, for example.

Hereinafter, each step is described in the method of manufacturing the silicone cured product of this embodiment.

(Curing Step)

The curing step is the step of curing the additional polyorganosiloxane composition by the hydrosilylation reaction under closed atmosphere at a temperature of not lower than 40° C. nor higher than 200° C. to obtain the primary cured product.

The additional polyorganosiloxane composition used in the curing step contains a polyorganosiloxane containing alkenyl groups, a polyorganohydrogensiloxane having a hydrogen atom bonded to a silicon atom, and a hydrosilylation reaction catalyst. In a case of using the additional polyorganosiloxane composition having the alkoxy group having 1 to 3 carbon atoms (hereinafter, also referred to an additional polyorganosiloxane composition (X).) as the additional polyorganosiloxane composition used in the curing step, an effect in this embodiment is remarkable, which is preferable. Incidentally, that the additional polyorganosiloxane composition has the alkoxy group having 1 to 3 carbon atoms means that any of the components has the alkoxy group having 1 to 3 carbon atoms.

As long as the additional polyorganosiloxane composition (X) contains the polyorganosiloxane containing alkenyl groups, the polyorganohydrogensiloxane having a hydrogen atom bonded to a silicon atom, and the hydrosilylation reaction catalyst, and is a composition in which any of the components has the alkoxy group having 1 to 3 carbon atoms, it is not particularly limited. The additional polyorganosiloxane composition (X) may be the composition in which a low-molecular siloxane, for example, a cyclic siloxane having 10 or less silicon atoms is not generated or the composition in which a low-molecular siloxane is not contained. The preferable examples of the additional polyorganosiloxane composition (X) will be described later. The additional polyorganosiloxane composition (X) contains the alkoxy group having 1 to 3 carbon atoms normally in a state of being bonded to a silicon atom.

The curing in the curing step is performed under a condition in which an alkenyl group of an alkenyl group-containing polyorganosiloxane and Si—H of polyorganohydrogensiloxane in the additional polyorganosiloxane composition are subjected to hydrosilylation reaction. Specifically, the curing in the curing step is performed under closed atmosphere at a temperature of not lower than 40° C. nor higher than 200° C.

Performing the curing under closed atmosphere specifically means that the additional polyorganosiloxane composition is sealed in the metal mold or the like to be subjected to hydrosilylation reaction. As a curing method by using the metal mold, there can be cited injection molding, compression molding, transfer molding, or the like, and in the method of manufacturing the silicone cured product of this embodiment, the curing is particularly preferably performed by the injection molding.

A temperature condition in the curing step is not lower than 40° C. nor higher than 200° C. A curing temperature is preferably 80 to 180° C. Depending on the curing temperature, a curing time is preferably 0.5 minute or more and less than 5 hours, and more preferably about 1 minute to about 2 hours.

In the above-described curing conditions, although the hydrosilylation reaction in the additional polyorganosiloxane composition is sufficiently performed, in the obtained primary cured product, the functional group contained in the additional polyorganosiloxane composition remains as it is or after being transformed in the cured product. For example, in the additional polyorganosiloxane composition (X), many of alkoxy groups having 1 to 3 carbon atoms are in a state of being bonded to silicon atoms, or remain as a compound having alkyl groups each having 1 to 3 carbon atoms derived from the alkoxy groups.

In the primary cured product, a residual amount of the functional group of the additional polyorganosiloxane composition, for example, a residual amount of the alkoxy group having 1 to 3 carbon atoms in a case of using the additional polyorganosiloxane composition (X) has a correlation with the total generation amount of the volatile component (Y) in the primary cured product. The total generation amount of the volatile component (Y) in the primary cured product can be measured in a similar manner to measure the total generation amount of the volatile component (Y) in the above-described silicone cured product. The total generation amount of the volatile component (Y) in the primary cured product is, for example, an amount exceeding 10 ppm, and typically, a range of more than 10 ppm and 100 ppm or less can be cited.

Incidentally, the curing step may have high-temperature heat treatment for removing such a low-molecular siloxane as described above from the primary cured product after curing by the hydrosilylation reaction. A temperature of the high-temperature heat treatment is, for example, higher than a temperature of the hydrosilylation reaction to be 170 to 250° C., and preferably to be 180 to 200° C. A time of the high-temperature heat treatment is preferably 1 to 8 hours, and more preferably 2 to 6 hours.

However, when the primary cured product in which a generation source of the volatile component (Y) such as the alkoxy group having 1 to 3 carbon atoms remains is subjected to the high-temperature heat treatment, the generation source of the volatile component (Y) such as the above-described alkoxy group in the primary cured product is considered to be desorbed from a chain or oxidized, by the high-temperature heating, to newly produce a low-molecular compound derived from the generation source of the volatile component (Y) such as the alkoxy group, typically, a compound having the alkyl group having 1 to 3 carbon atoms, particularly, the volatile component (Y). The total generation amount of the volatile component (Y) in the primary cured product is thereby assumed to be increased. Accordingly, the time of the high-temperature heat treatment is preferably 4 hours or less, and it is particularly preferable to perform no high-temperature heat treatment. In the method of this embodiment, even in such a case as to perform no high-temperature heat treatment, performing the following heating step makes it possible to perform the removal of the low-molecular siloxane together.

(Heating Step)

In the method of manufacturing the silicone cured product of the embodiment of this embodiment, the above obtained primary cured product is heated under open atmosphere or reduced pressure at a temperature of not lower than 60° C. nor higher than 160° C. in the heating step. By being heated under the conditions, the volatile component (Y) or its generation source, for example, the low-molecular compound having the alkoxy group having 1 to 3 carbon atoms or the alkyl group having 1 to 3 carbon atoms derived from the alkoxy group having 1 to 3 carbon atoms in a case of using the additional polyorganosiloxane composition (X), which the primary cured product has, is removed. Moreover, in a case where the primary cured product contains the low-molecular siloxane, for example, the cyclic siloxane having 10 or less silicon atoms, it can also be removed by the heating step.

As long as a heating temperature is 60° C. or higher, in a case of containing volatile components having a boiling point of 60° C. or lower, they can be removed. In terms of more highly removing a volatile component up to having a high boiling point, the heating temperature is preferably 80° C. to 150° C., and more preferably 100° C. to 150° C. A temperature exceeding 160° C. causes the new volatile component as described above, for example, the volatile component (Y) or its generation source, specifically, a compound having the alkyl group having 1 to 3 carbon atoms derived from the alkoxy group having 1 to 3 carbon atoms, which the primary cured product has in a case of using the additional polyorganosiloxane composition (X), to be produced, and the produced amount sometimes exceeds a removed amount.

Further, the heating in the heating step is performed under open atmosphere or reduced pressure. Heating under open atmosphere means that the primary cured product is heated in an atmosphere at normal pressure (760 mmHg). The heating is preferably performed under reduced pressure, namely with the atmosphere in a state of reduced pressure from the viewpoint of shortening a heating time. A degree of reduced pressure of the atmosphere at this time is, for example, preferably 10 mmHg or less, and more preferably 5 mmHg or less.

The heating time is preferably about 2 hours to about 24 hours, and more preferably 10 hours to 24 hours, depending on conditions such as an amount and the heating temperature of the primary cured product, and whether heating is performed under open atmosphere or reduced pressure.

(Solvent Contact Step)

In the method of this embodiment, it is preferable to provide the step of bringing the primary cured product into contact with the solvent prior to the above-described heating step after the above-described curing step. Note that the solvent contact step may be performed after the heating step, but performing the heating step after the solvent contact step allows the heating step to be combined with drying of the solvent, which is thus preferable. Bringing the primary cured product into contact with the solvent makes it possible to extract and remove the volatile component contained in the primary cured product, for example, the compound having the alkyl group having 1 to 3 carbon atoms derived from the alkoxy group having 1 to 3 carbon atoms into the solvent. As a contact method, an extraction by immersion, or the like can be cited.

The solvent used at this time is the one which dissolves the above-described volatile component without dissolving the primary cured product, and the type thereof does not matter as long as it is a solvent capable of drying by low-temperature treatment at 160° C. or lower such as the heating step. As the solvent, for example, acetone, hexane, or the like can be used. A temperature of the solvent in the solvent contact step is, for example, preferably 10 to 40° C. A contact time is, for example, preferably 8 to 48 hours, and more preferably 16 to 24 hours.

(Additional Polyorganosiloxane Composition)

The additional polyorganosiloxane composition used in the embodiment is not limited as long as it is a composition containing the alkenyl group-containing polyorganosiloxane, the polyorganohydrogensiloxane, and the hydrosilylation reaction catalyst, and typically, the additional polyorganosiloxane composition (X) any of whose components have the alkoxy group having 1 to 3 carbon atoms is used.

The additional polyorganosiloxane composition (X) includes, for example, (A) a polyorganosiloxane mixture composed of 50 to 100 mass % of (A1) a straight-chain polyorganosiloxane having two or more alkenyl groups on average in one molecule and 50 to 0 mass % of (A2) a resinoid polyorganosiloxane having 1.5 or more alkenyl groups on average in one molecule, (B) a polyorganohydrogensiloxane containing Si—H of 5 mmol/g or more in an amount in which a molar ratio of the Si—H to the alkenyl group of the component (A) (the number of moles of the Si—H/the number of moles of the alkenyl group) is 1.0 to 3.0, and (C) a hydrosilylation reaction catalyst, and at least one of the (A) polyorganosiloxane mixture and the (B) polyorganohydrogensiloxane is preferably an additional polyorganosiloxane composition (X1) having the alkoxy group having 1 to 3 carbon atoms.

The additional polyorganosiloxane composition (X1) may contain the later-described optional components other than the above-described components of (A) to (C). Hereinafter, the components contained in the additional polyorganosiloxane composition (X1) will be described.

The component (A) is a component serving as a base polymer of the additional polyorganosiloxane composition (X1). The component (A) is the polyorganosiloxane mixture composed of 50 to 100 mass % of the (A) straight-chain polyorganosiloxane having two or more alkenyl groups on average in one molecule and 50 to 0 mass % of the (A2) resinoid polyorganosiloxane having 1.5 or more alkenyl groups on average in one molecule.

As described above, at least one of the component (A) and the component (B) has the alkoxy group having 1 to 3 carbon atoms. This alkoxy group is contained in a state of being bonded to a silicon atom in at least one of the component (A) and the component (B). When the component (B) has the alkoxy group having 1 to 3 carbon atoms, the component (A) may have or need not have the alkoxy group having 1 to 3 carbon atoms.

When the component (A) contains the alkoxy group having 1 to 3 carbon atoms, at least one of the component (A1) and the component (A2) has the alkoxy group having 1 to 3 carbon atoms. From the viewpoints of reducing an amount of the generation source of the volatile component (Y) in the primary cured product to reduce a load on the heating step in the method of this embodiment and suppressing the total generation amount of the volatile component (Y) in the silicone cured product, the number of the alkoxy groups having 1 to 3 carbon atoms contained in the component (A) is preferably 0.025 or less relative to the number of hydrocarbon groups other than the alkenyl group. On one hand, in a manufacturing process of the component (A1) and the component (A2), from the viewpoint of reducing a load for suppressing that the alkoxy group having 1 to 3 carbon atoms is contained, the number of the alkoxy groups having 1 to 3 carbon atoms in the component (A) is preferably 0.001 or more relative to the number of hydrocarbon groups other than the alkenyl group.

That is, a value of a ratio represented by the number of moles of the alkoxy group having 1 to 3 carbon atoms/the number of moles of the hydrocarbon group other than the alkenyl group in the component (A) (hereinafter referred to as "alkoxy group/hydrocarbon group".) is preferably not less than 0.001 nor more than 0.025.

The alkoxy group/hydrocarbon group in the component (A) is more preferably 0.018 or less from the above-described viewpoints. Note that the alkoxy group/hydrocarbon group in the (A) polyorganosiloxane mixture can be easily found by measuring the content (the number of moles) of each of the alkoxy group having 1 to 3 carbon atoms, the alkenyl group and the other hydrocarbon group by nuclear magnetic resonance spectroscopy (NMR) or the like. The later-described component (A1), component (A2) and component (B) are also similar.

The component (A1) is the straight-chain polyorganosiloxane having two or more alkenyl groups on average in one molecule (hereinafter also referred to as "straight-chain polyorganosiloxane".). The alkenyl group of the (A1) straight-chain polyorganosiloxane may be bonded to a silicon atom at either of an end and a middle of a chain, or the alkenyl groups may be bonded to silicon atoms at both of the end and the middle of the chain.

As the alkenyl group bonded to a silicon atom in the component (A1), there can be cited the one having 2 to 8 carbon atoms, more preferably 2 to 4, such as a vinyl group, an allyl group, a butenyl group, a pentenyl group, a hexenyl group, and a heptenyl group. In particular, the vinyl group is preferable.

In the component (A1), as an organic group bonded to a silicon atom other than the alkenyl group, an unsubstituted or substituted monovalent hydrocarbon group can be cited. As the unsubstituted monovalent hydrocarbon group, there can be cited: an alkyl group having 1 to 10 carbon atoms, such as a methyl group, an ethyl group, a propyl group, a butyl group, a pentyl group, a hexyl group, a cyclohexyl group, or a heptyl group; an aryl group having 6 to 14 carbon atoms, such as a phenyl group, a tolyl group, a xylyl group, or a naphthyl group; and an aralkyl group having 7 to 14 carbon atoms, such as a benzyl group or a phenethyl group. Further, as the substituted monovalent hydrocarbon group, a halogenated alkyl group such as a chloromethyl group, a 3-chloropropyl group, or a 3,3,3-trifluoropropyl group can be cited. As the organic group other than the alkenyl group, the methyl group or the phenyl group is preferable.

The viscosity of the component (A1) at 25° C. is, for example, 10,000 to 1,000,000 mPa·s (10 to 1,000 Pa·s). The viscosity of the component (A1) is preferably 10,000 to 700,000 mPa·s, more preferably 50,000 to 500,000 mPa·s, and particularly preferably 60,000 to 200,000 mPa·s. When the viscosity of the component (A1) falls within a range of 10,000 to 1,000,000 mPa·s, workability of the obtained composition is good, and in addition physical properties of the cured product obtained from this composition become good. Note that the viscosity can be measured at 20° C. to 25° C. by using, for example, a rheometer or a rotational viscometer. In this specification, unless otherwise stated, the viscosity means a viscosity measured at 25° C. by using the rotational viscometer in conformity with JIS K6249.

As specific examples of the component (A1), there can be cited a both ends trimethylsiloxy group-terminated dimethylsiloxane/methylvinylsiloxane copolymer, a both ends dimethylvinylsiloxy group-terminated dimethylsiloxane/methylphenylsiloxane copolymer, a both ends dimethylvinylsiloxy group-terminated dimethylpolysiloxane, a both ends dimethylvinylsiloxy group-terminated dimethylsiloxane/methylvinylsiloxane copolymer, a both ends dimethylvinylsiloxy group-terminated dimethylsiloxane/methylvinylsiloxane/methylphenysiloxane copolymer, a both ends trivinylsiloxy group-terminated dimethylpolysiloxane, a both ends dimethylvinylsiloxy group-terminated dimethylsiloxane/diphenylsiloxane copolymer, or the like.

One type of these polymers and copolymers can be used alone or two or more types of them can be used in combination. Among these, when a straight-chain polyorganosiloxane in which all organic groups other than alkenyl groups bonded to silicon atoms are methyl groups, namely, a both ends trimethylsiloxy group-terminated dimethylsiloxane/methylvinylsiloxane copolymer, a both ends dimethylvinylsiloxy group-terminated dimethylpolysiloxane, a both ends dimethylvinylsiloxy group-terminated dimethylsiloxane/methylvinylsiloxane copolymer, and a both ends trivinylsiloxy group-terminated dimethylpolysiloxane are used, a cured product excellent in mechanical properties can be obtained. In particular, when the component (A1) is constituted of the straight-chain polyorganosiloxane in which all the organic groups other than the alkenyl groups are the methyl groups and does not contain a polyorganosiloxane having phenyl groups, a cured product excellent in tensile strength, elongation, and the like can be obtained. On the other hand, when the polyorganosiloxane having phenyl groups is contained, an improvement in cold resistance is promising.

The straight-chain polyorganosiloxane of the component (A1) may contain the alkoxy group having 1 to 3 carbon atoms. When the straight-chain polyorganosiloxane of the component (A1) contains the alkoxy group having 1 to 3 carbon atoms, it has a structure in which a part of the above-described organic group bonded to a silicon atom is substituted by the alkoxy group having 1 to 3 carbon atoms. When the component (A1) contains the alkoxy group having 1 to 3 carbon atoms, an alkoxy group/hydrocarbon group is preferably not less than 0.001 nor more than 0.025 as the component (A) obtained by mixing the component (A1) and the component (A2). Note that the alkoxy group/hydrocarbon group in the component (A1) is preferably not less than 0.001 nor more than 0.025, for example.

The component (A2) is a resinoid polyorganosiloxane having 1.5 or more alkenyl groups on average in one molecule (hereinafter, also simply referred to as a "resinoid polyorganosiloxane".). The component (A2) is, for example, a resinoid polyorganosiloxane having a resin structure (three-dimensional network structure) including a tetrafunctional siloxane unit (hereinafter, referred to as a Q unit.) represented by a formula: $SiO_4/_2$. A more preferable range of the number of alkenyl groups falls within 1.8 or more on average in one molecule, and a further preferable range falls within 1.9 or more on average.

The (A2) resinoid polyorganosiloxane is an optional component, and serves as a polymer component of the additional polyorganosiloxane composition (X1) together with the (A1) straight-chain polyorganosiloxane. The (A2) resinoid polyorganosiloxane can impart excellent hardness to the silicone cured product obtained in this embodiment. Therefore, in a case where the silicone cured product demands high hardness, the additional polyorganosiloxne composition (X1) preferably contains the (A2) resinoid polyorganosiloxane.

When the (A2) resinoid polyorganosiloxane contains the alkoxy group having 1 to 3 carbon atoms, the number of the alkoxy groups having 1 to 3 carbon atoms contained in the component (A2) is preferably not less than 0.005 nor more than 0.030 relative to the number of hydrocarbon groups other than the alkenyl group. That is, an alkoxy group/hydrocarbon group is preferably not less than 0.005 nor more than 0.030.

The alkoxy group/hydrocarbon group in the component (A2) is more preferably 0.020 or less, and particularly preferably 0.015 or less from the viewpoints of reducing an amount of the generation source of the volatile component (Y) in the primary cured product to reduce a load on the heating step in the method of this embodiment and suppressing the total generation amount of the volatile component (Y) in the silicone cured product. On one hand, in a manufacturing process of the component (A2), from the viewpoint of reducing a load for suppressing that the alkoxy group having 1 to 3 carbon atoms is contained, the alkoxy group/hydrocarbon group is preferably 0.005 or more. Note that when the component (A1) or the component (B) contains the alkoxy group having 1 to 3 carbon atoms, the resinoid polyorganosiloxane being the component (A2) may be a polyorganosiloxane in which an alkoxy group bonded to a silicon atom in one molecule is 0 pieces and a value of the alkoxy group/hydrocarbon group is "0" (zero).

As the resinoid polyorganosiloxane being the component (A2), it is preferable to use a resinoid polyorganosiloxane having a three-dimensional network structure, which contains a monofunctional siloxane unit represented by a formula: $R^1{}_3SiO_{1/2}$, a bifunctional siloxane unit represented by a formula: $R^1{}_2SiO_2$, and a tetrafunctional siloxane unit (Q unit) represented by a formula: $SiO_{4/2}$ at a molar ratio of monofunctional siloxane unit:bifunctional siloxane unit:Q unit=a:b:c on average, and has 1.5 or more alkenyl groups on average in one molecule. This resinoid polyorganosiloxane can be represented by an average unit formula: $(R^1{}_3SiO_{1/2})_a(R^1{}_2SiO_{2/2})_b(SiO_{4/2})_c$.

The above-described resinoid polyorganosiloxane can include an alkoxy group represented by —$OR^0$ ($R^0$ is an unsubstituted alkyl group having 1 to 3 carbon atoms.), which is bonded to a silicon atom. The above-described resinoid polyorganosiloxane including an —$OR^0$ group bonded to a silicon atom (hereinafter, indicated by a resinoid polyorganosiloxane (A2a).) can be represented by, for example, an average unit formula: $(R^1{}_3SiO_{1/2})_a(R^1{}_2Si_{2/2})_b(SiO_{4/2})_c(R^0O_{1/2})_p$. In the average unit formula, each $R^1$ is independently an alkenyl group or a substituted or unsubstituted alkyl group. Hereinafter, unless otherwise stated, the —$OR^0$ group bonded to a silicon atom is also simply mentioned as an "—$OR^0$ group".

As the unsubstituted alkyl group in $R^1$, there can be cited a methyl group, an ethyl group, a propyl group, a butyl group, a pentyl group, a hexyl group, a heptyl group, or the like. As the substituted alkyl group, there can be cited a halogen-substituted alkyl group in which a hydrogen atom is substituted by a halogen atom, such as a chloromethyl group, a 3-chloropropyl group, or a 3,3,3-trifluoropropyl group. As the substituted or unsubstituted alkyl group, the methyl group is preferable.

The number of the alkenyl groups present in one molecule of the resinoid polyorganosiloxane (A2a) is 1.5 or more on average. As the alkenyl group, there can be cited a vinyl group, an allyl group, a butenyl group, a pentenyl group, a hexenyl group, a heptenyl group, or the like. The vinyl group is preferable. $R^0$ is normally a methyl group or an ethyl group.

a, b, and c are $0.3 \leq a \leq 0.6$, $0 \leq b \leq 0.1$, and $0.4 \leq c \leq 0.7$ and preferably positive numbers satisfying a relationship of a+b+c=1. More preferable ranges of a, b, and c are $0.35 \leq a \leq 50.55$, $0 \leq b \leq 0.05$, and $0.45 \leq c \leq 0.65$.

p in the average unit formula of the resinoid polyorganosiloxane (A2a) is a positive number in which a molar ratio of the alkoxy group to the substituted or unsubstituted alkyl group (alkoxy group/hydrocarbon group) is preferably set to 0.030 or less, more preferably 0.020 or less. In the resinoid polyorganosiloxane (A2a), a lower limit of p is preferably a positive number in which the alkoxy group/hydrocarbon group is set to 0.005.

As the resinoid polyorganosiloxane being the component (A2), in siloxane units, a copolymer constituted of a monofunctional siloxane unit (hereinafter, also referred to as an $R^4{}_3SiO_{1/2}$ unit.) represented by a formula 1: $R^4{}_3SiO_{1/2}$ ($R^4$ is an unsubstituted alkyl group, and a plurality of $R^4$s may be different from each other. hereinafter the same.), a monofunctional siloxane unit (hereinafter, also referred to as an $R^4{}_2R^5SiO_{1/2}$ unit.) represented by a formula 2: $R^4{}_2R^5SiO_{1/2}$ ($R^5$ is an alkenyl group. hereinafter the same.), a bifunctional siloxane unit (hereinafter, also referred to as an $R^4{}_2SiO_{2/2}$ unit.) represented by a formula 3: $R^4{}_2SiO_{2/2}$, and a tetrafunctional siloxane unit (Q unit) represented by a formula 4: $SiO_{4/2}$, a copolymer constituted of the $R^4{}_3SiO_{1/2}$ unit, the $R^4{}_3R^5SiO_{1/2}$ unit, and the Q unit, a copolymer constituted of $R^4{}_2R^5SiO_{1/2}$, the $R^4{}_2SiO_{2/2}$ unit, and the Q unit, or the like can be cited. One type of these copolymers can be used alone or two or more types of them can be used in combination.

As the $R^4$s in the above-described formula 1 and formula 2, specifically, a group similar to the unsubstituted alkyl group in the $R^1$ can be cited, and a preferable state is also similar. As the alkenyl group which is the $R^5$ in the above-described formula 2, specifically, there can be cited a vinyl group, an allyl group, a butenyl group, a pentenyl group, a hexenyl group, a heptenyl group, or the like, and the vinyl group is preferable.

Among the aforesaid copolymers, the copolymer constituted of the $R^4{}_3SiO_{1/2}$ unit, the $R^4{}_2R^5SiO_{1/2}$ unit, and the Q unit in the siloxane units is preferable. As the (A2) resinoid polyorganosiloxane, specifically, the resinoid polyorganosiloxane constituted of the $R^4{}_3SiO_{1/2}$ unit, the $R^4{}_2R^5SiO_{1/2}$ unit, and the Q unit in the siloxane units and having —$OR^0$ groups (hereinafter, indicated by a resinoid polyorganosiloxane (A2b).) can be cited.

From the viewpoints of reducing an amount of the generation source of the volatile component (Y) in the primary cured product to reduce a load on the heating step in the method of this embodiment and reducing the total generation amount of the volatile component (Y) in the silicone cured product, the —OR groups which the resinoid polyorganosiloxane (A2b) has are preferably as few as possible. In the method of this embodiment, finally, in the heating step, since the —$OR^0$ groups are removed, the —$OR^0$ groups may be contained to a degree of the above-described lower limit value. That enables the reduction in a load in the following manufacturing process of the (A2) resinoid polyorganosiloxane. From such a viewpoint, in the resinoid polyorganosiloxane (A2b), the alkoxy group/hydrocarbon group is preferably not less than 0.005 nor more than 0.030.

As the resinoid polyorganosiloxane (A2b), more specifically, in the siloxane units, a copolymer constituted of a monofunctional siloxane unit (hereinafter, indicated as an $M^{vi}$ unit.) represented by a formula: $(CH_3)_2(CH=CH)SiO_{1/2}$, a monofunctional siloxane unit (hereinafter, indicated as an M unit.) represented by a formula: $(CH_3)_3SiO_{1/2}$, and a tetrafunctional siloxane unit (Q unit) represented by a formula: $SiO_{4/2}$ is preferable. Further, a copolymer which is constituted of only such siloxane units and has the —$OR^0$ group and in which the alkoxy group/hydrocarbon group is preferably not less than 0.005 nor more than 0.030 is particularly preferable.

In general, a resinoid polyorganosiloxane can be obtained by adding water to chlorosilane and alkoxysilane and hydrolyzing them in a solvent such as xylene. In order to obtain the above-described (A2) resinoid polyorganosiloxane, it is necessary to cause a hydrolysis reaction while adjusting a content ratio of alkoxy groups (methoxy groups, ethoxy groups, or the like) below a certain level. A method of adjusting the content ratio of the alkoxy groups below a certain level is not particularly limited, and there is a method of performing extraction and removal using a water-soluble solvent such as alcohol or acetone, which controls a reaction temperature, a time, and the like of hydrolysis, or the like, and for example, performing the below-mentioned steps of (1) to (3) in order makes it possible to stably obtain the (A2) resinoid polyorganosiloxane in which the content ratio of the alkoxy group is suppressed to be smaller and the alkoxy group/hydrocarbon group is 0.030 or less. From the above-described reason, the alkoxy group/hydrocarbon group of the (A2) resinoid polyorganosiloxane may be 0.005 or more.

(1) a step of hydrolyzing at least three types of silicon compounds selected from formulas: $R^1_3SiW$, $R^1_2SiW_2$, and $SiW_4$ by using a mixed solution of acetone and water.

(2) a step of removing acid and acetone by water washing after the step (1).

(3) a step of adding alkali and performing heating after the step (2).

In the silicon compounds used as a starting material in the step (1), each R1 is independently an alkenyl group or a substituted or unsubstituted alkyl group, and the same groups as those described above can be cited. Further, each W is independently a chlorine atom, an alkoxy group, or a hydroxyl group. As such silicon compounds, there can be cited tetraethoxysilane, chlorodimethylvinylsilane, chlorotrimethylsilane, dichlorodimethylsilane, and the like. Then, three or more types are selected from these silicon compounds to be used.

Note that in at least one type among the three types of silicon compounds used as the starting material, the one having one or more alkenyl groups is used as the $R^1$. Further, in at least one type of the silicon compound, the one having one or more chlorine atoms is preferably used as the W.

A mixing ratio of acetone and water preferably falls within a range in which acetone:water is 1:1 to 1:4 (mass ratio). The hydrolysis can be performed by a publicly-known method. Further, in the step (2), a method of the water washing is not particularly limited, and a publicly-known method can be used.

In the step (3), as alkali added to a solution obtained in the step (2), a potassium hydroxide, a cesium hydroxide, or the like can be cited. Then, after adding, heating, and dehydrating such alkali by a publicly-known method, neutralization is performed using a phosphoric acid or the like, to obtain the (A2) resinoid polyorganosiloxane.

A suitable mass average molecular weight Mw of the (A2) resinoid polyorganosiloxane is 1,500 to 10,000, and a range of 1,800 to 8,000 is more preferable. Note that Mw is a value converted into polystyrene by gel permeation chromatography (hereinafter, indicated as GPC.). When Mw of the resinoid polyorganosiloxane is less than 1,500, sufficient mechanical strength cannot be stably obtained, and when it exceeds 10,000, a viscosity of the additional polyorganosiloxane composition (X1) becomes high and moldability deteriorates by losing fluidity.

A compounding ratio between the (A2) resinoid polyorganosiloxane and the (A1) straight-chain polyorganosiloxane is, relative to a total (100 mass %) of the component (A1) and the component (A2), preferably a ratio of 50 to 100 mass % of the component (A1) and 50 to 0 mass % of the component (A2). When the compounding ratio of the component (A2) exceeds 50 mass %, an increase in an amount of the generation source of the volatile component (Y) in the primary cured product makes the total generation amount of the volatile component (Y) in the finally obtained silicone cured product large in some cases. The compounding ratio between the (A2) resinoid polyorganosiloxane and the (A1) straight-chain polyorganosiloxane is, relative to a total (100 mass %) of the component (A1) and the component (A2), more preferably a ratio of 50 to 99 mass % of the component (A1) and 50 to 1 mass % of the component (A2), and further preferably a ratio of 50 to 95 mass % of the component (A1) and 50 to 5 mass % of the component (A2).

Setting the compounding ratio between the component (A1) and the component (A2) in the above-described range makes it easy to adjust the alkoxy group/hydrocarbon group as the component (A) to not less than 0.001 nor more than 0.025.

<Component (B)>

The component (B) is a polyorganohydrogensiloxane which has one or more hydrogen atoms bonded to silicon atoms (Si—H) and in which a content of Si—H is 5 mmol/g or more. The Si—H of the polyorganohydrogensiloxane being the component (B) is subjected to the hydrositylation reaction with the alkenyl group of the component (A) to obtain the primary cured product. A molecular structure of the component (B) is not particularly limited, and for example, various types, such as straight-chain, cyclic, branched, and three-dimensional network types, of polyorganohydrogensiloxanes can be used. One type of the component (B) can be used alone or two or more types of them can be used in combination.

As the component (B), from the viewpoints of easiness of control of a viscosity and a Si—H amount and removal of the low-molecular siloxane, a straight-chain polyorganohydrogensiloxane is preferable. Further, the one having a three-dimensional network structure (resinoid polyorganohydrogensiloxane) is preferably used as the component (B) because it imparts high crosslink density to a cured product, thereby imparting high hardness to the cured product. The straight-chain polyorganohydrogensiloxane is further effective in that as compared with the resinoid polyorganohydrogensiloxane, an amount of the alkoxy group having 1 to 3 carbon atoms is easy to reduce and an amount of the generation source of the volatile component (Y) in the primary cured product and the total generation amount of the volatile component (Y) in the finally obtained silicone cured product can be reduced more.

In the polyorganohydrogensiloxane being the component (B), the average degree of polymerization corresponds to the number of silicon atoms in one molecule and is also the number of siloxane units present in one molecule. The average degree of polymerization of the component (B) is preferably 10 or more, more preferably 10 to 250, and further preferably 30 to 200. Further, in terms of curability, the content of Si—H per unit mass of the component (B) is 5 mmol/g or more. The content of Si—H preferably falls within a range of 5.5 to 13.0 mmol/g.

When the polyorganohydrogensiloxane being the component (B) is straight-chain, the Si—H may be located at only either of the end and the middle of a molecular chain or located at both of them. In terms of moderately adjusting hardness of the silicone cured product, a straight-chain polyorganohydrogensiloxane having Si—H at the middle of the molecular chain is preferable.

More specifically, the straight-chain polyorganohydrogensiloxane of the component (B) is preferably a straight-chain polyorganohydrogensiloxane represented by a molecular formula: $(R^3_3SiO_{1/2})(R^3HSiO_{1/2})_x(R^3_2SiO_{2/2})_y(R^3_2SiO_{1/2})$, or a molecular formula: $(R^3_2HSiO_{1/2})(R^3HSiO_{2/2})_x(R^3_2SiO_{2/2})_y(R^3_2HSiO_{1/2})$. This straight-chain polyorganohydrogensiloxane has a structure in which a part of $R^3$ in the above-described molecular formulas is substituted by the alkoxy group having 1 to 3 carbon atoms when it contains the alkoxy group having 1 to 3 carbon atoms.

In the above-described molecular formulas, each $R^3$ is independently a substituted or unsubstituted monovalent hydrocarbon group except an alkenyl group. As the $R^3$, there can be cited: an alkyl group having 1 to 10 carbon atoms, such as a methyl group, an ethyl group, a propyl group, a butyl group, a pentyl group, a hexyl group, a cyclohexyl group, or a heptyl group; an aryl group having 6 to 14 carbon atoms, such as a phenyl group, a tolyl group, a xylyl group, or a naphthyl group: an aralkyl group having 7 to 14 carbon atoms, such as a benzyl group or a phenethyl group; and a halogenated alkyl group such as a chloromethyl group, a 3-chloropropyl group, or a 3,3,3-trifluoropropyl group. As the $R^3$, the methyl group or the phenyl group is preferable.

In the aforesaid formulas, it is preferable that both of x and y are positive integers, and relationships of $8 \le x+y \le 200$ and $0.4 \le x/(x+y) \le 0.8$ are satisfied. Here, (x+y) represents the number of siloxane units at the middle of a molecular chain. Note that in this polyorganohydrogensiloxane, the average degree of polymerization which is the number of silicon atoms in one molecule is represented x+y+2. x+y preferably falls within a range of not less than 30 nor more than 200.

Further, a polyorganohydrogensiloxane having a three-dimensional network structure (resinoid) which has a $R^6{}_2HSiO_{1/2}$ unit (each $R^6$ is independently a substituted or unsubstituted monovalent hydrocarbon group except an alkenyl group. Specifically, a group similar to the above-described $R^3$ can be cited, and a preferable state is also similar.) and a Q unit can be used as the component (B) in terms of imparting high hardness to the silicone cured product while having tractable proper viscosity.

As the above-described resinoid polyorganohydrogensiloxane, more specifically, a polyorganohydrogensiloxane having at least a $(CH_3)_2HSiO_{1/2}$ unit (hereinafter, each indicated as an $M^H$ unit.) and a $SiO_{4/2}$ unit (Q unit) can be cited. This polyorganohydrogensiloxane can further have a $(CH_3)_3SiO_{1/2}$ unit (hereinafter, each indicated as an M unit.) and/or a $CH_3SiO_{3/2}$ unit (hereinafter, each indicated as a T unit.).

In a ratio of the $M^H$ unit to the Q unit, a ratio of the $M^H$ unit to 1 mol of the Q unit is preferably 1.5 to 2.2 mol, and further preferably 1.8 to 2.1 mol. Typically, a polymethylhydrogensiloxane having a structure in which the four to five Q units and the $M^H$ units and/or M units (where, at least three $M^H$ units are in a molecule) are bonded to each other as represented by a formula: $[(CH_3)_2HSiO_{1/2}]_8[SiO_{4/2}]_4$ or a formula: $[(CH_3)_2HSiO_{1/2}]_{10}[SiO_{4/2}]_5$ is particularly preferable.

Further, the (B) polyorganohydrogensiloxane sometimes has an alkoxy group, specifically, the alkoxy group having 1 to 3 carbon atoms in a state of being bonded to a silicon atom. When the component (A) contains the alkoxy group having 1 to 3 carbon atoms bonded to a silicon atom, the (B) polyorganohydrogensiloxane may contain or need not contain the alkoxy group having 1 to 3 carbon atoms bonded to a silicon atom.

When the (B) polyorganohydrogensiloxane has the alkoxy group having 1 to 3 carbon atoms, the number of the alkoxy groups having 1 to 3 carbon atoms which are contained in the (B) polyorganohydrogensiloxane is preferably not less than 0.01 nor more than 0.15 relative to the number of Si—Hs. That is, an alkoxy group/Si—H (molar ratio) is preferably not less than 0.01 nor more than 0.15.

In the component (B), the alkoxy group/Si—H (molar ratio) is more preferably 0.10 or less, and particularly preferably 0.08 or less from the viewpoints of reducing an amount of the generation source of the volatile component (Y) in the primary cured product to reduce a load on the heating step in the method of this embodiment and suppressing the total generation amount of the volatile component (Y) in the silicone cured product. On one hand, in a manufacturing process of the component (B), from the viewpoint of reducing a load for suppressing that the alkoxy group having 1 to 3 carbon atoms is contained, the alkoxy group/Si—H (molar ratio) is preferably 0.01 or more. In the method of this embodiment, finally, in the heating step, since the alkoxy groups having 1 to 3 carbon atoms are removed, the alkoxy groups having 1 to 3 carbon atoms may be contained to a degree of the above-described lower limit value. That enables the reduction in a load in the manufacturing process of the component (B).

A compounding amount of this straight-chain or resinoid polyorganohydrogensiloxane being the component (B) is an effective amount in which the hydrosilylation reaction between the above-described component (A) and component (B) progresses to cure the additional polyorganosiloxane composition (X1). Specifically, relative to 1 mol of the alkenyl groups in the component (A), an amount in which the Si—H in the component (B) is 1.0 to 3.0 mol is set. That is, an amount in which a molar ratio of the Si—H in the component (B) to the alkenyl group in the component (A) (the number of moles of the Si—H/the number of moles of the alkenyl group; hereinafter, indicated by "Si—H/alkenyl group".) is 1.0 to 3.0 is set. A preferable range of the Si—H/alkenyl group is a range of 1.5 to 2.5. The hydrosilylation reaction does not progress when the Si—H/alkenyl group is less than 1.0, thereby causing a possibility that the primary cured product is difficult to obtain, and much unreacted Si—H remains in the primary cured product when the Si—H/alkenyl group exceeds 3.0, thereby causing a possibility that physical properties of the primary cured product and the obtained silicone cured product change with time.

<Component (C)>

The hydrosilylation reaction catalyst being the component (C) is a catalyst which accelerates an addition reaction (hydrosilylation reaction) of the alkenyl groups in the component (A) with the Si—H in the component (B). The content of the hydrosilylation reaction catalyst in the additional polyorganosiloxane composition (X1) is an amount capable of accelerating this hydrosilylation reaction (catalytic amount). The hydrosilylation reaction catalyst is not particularly limited as long as it is the one which accelerates the hydrosilylation reaction. A platinum-based metal compound is preferable, and a metal-based catalyst such as palladium, rhodium, cobalt, nickel, ruthenium, or iron can also be used.

As the platinum-based metal compound, for example, a chloroplatinic acid, an alcohol solution of a chloroplatinic acid, a platinum complex having olefins, a vinyl group-containing siloxane, or an acetylene compound as a ligand, or the like can be used.

When the platinum-based metal compound is used as the (C) hydrosilylation reaction catalyst, its compounding amount is an amount in which a content ratio relative to the whole of the composition is 0.5 to 10 mass ppm in terms of a platinum element. It is more preferably 1 to 5 mass ppm, and further preferably 1 to 3 mass ppm. When the compounding amount of the platinum-based metal compound is less than 0.5 mass ppm, curability decreases remarkably, and when it exceeds 10 mass ppm, transparency of the cured product decreases. When it falls within this range, a cured product which reduces occurrence of the volatile component and is good in the physical properties can be obtained and there is also an economical advantage.

<Other Optional Component>

In the additional polyorganosiloxane composition (X1) used in this embodiment, as long as the effect of this embodiment is impaired, the other components normally contained in a polyorganosiloxane composition may be optionally compounded. The other optional components are a flame retardant, a curing reaction inhibitor, an inorganic filler, and so on.

The flame retardant imparts flame retardancy to the silicone cured product obtained from the additional polyorganosiloxane composition (X1), and for example, it is possible to use phosphite represented by triphenylphosphite, trilaurylphosphite, trilauryltrithiophosphite, trisnonylphenylphosphite, and dibutylphosphite, phosphoric acid esters represented by trimethylphosphate, triethylphosphate, tributylphosphate, trioctylphosphate, trichloroethylphosphate, and triphenylphosphate, or the like, for example.

The curing reaction inhibitor is the one for adjusting a rate of the hydrosilylation reaction (curing rate) of the additional polyorganosiloxane composition (X1), and for example, it is possible to use the curing reaction inhibitor such as an acetylene alcohol such as 3-methyl-1-butine-3-ol, 2-phenyl-3-butine-2-ol, or 1-ethynylcyclohexanol and a maleic acid derivative such as diallyl maleate.

The inorganic filler is compounded for the purpose of imparting mechanical strength to the silicone cured product obtained from the additional polyorganosiloxane composition (X1) and improving adhesiveness, and it is an inorganic filler such as calcium carbonate or silica.

Further, as a method of adjusting the rate of the hydrosilylation reaction (curing rate) of the additional polyorganosiloxane composition (X), it is also possible to separate the composition into two liquids to prevent the progress of curing by the hydrosilylation reaction when it is stored, and then cause the curing by mixing the two liquids at the time of usage. In the two-liquid-mixing type, considering a risk of a dehydrogenation reaction, it is necessary to avoid wapping the polyorganohydrogensiloxane being the component (B) and the hydrosilylation reaction catalyst being the component (C) in the same package.

Note that when the additional polyorganosiloxane composition used in this embodiment, for example, the additional polyorganosiloxane composition (X), preferably the additional polyorganosiloxane composition (X) is used for, for example, a use of the later-described optical members, it is preferable to contain no inorganic filler. According to the method of this embodiment, even composition containing no inorganic filler makes it possible to obtain a silicone cured product having sufficient rubber hardness. Further, the mechanical properties (strength, elongation, and the like) of the silicone cured product are also good. When the additional polyorganosiloxane composition, for example, the additional polyorganosiloxane composition (X), preferably, the additional polyorganosiloxane composition (X1), containing no inorganic filler, is used, a silicone cured product having high transmittance of light (for example, visible light) can be obtained.

[Silicone Cured Product]

In the silicone cured product of the embodiment of this embodiment, when heated at 150° C. for 16 hours, the content of the total generation amount of the alcohol having 1 to 3 carbon atoms and the oxide thereof, and the alkyl group-containing silane compound having 1 to 3 carbon atoms (volatile component (Y)) is 10 ppm or less. Moreover, in the silicone cured product of the embodiment, the content of the low-molecular siloxane, for example, the cyclic siloxane having 10 or less silicon atoms is preferably reduced.

Thus, the silicone cured product of the embodiment of this embodiment is the silicone cured product in which the gas generation of the volatile component is reduced significantly even in a case of being exposed to high temperatures equal to or higher than room temperature for a long time. Accordingly, it has an effect of suppressing an adverse influence on peripheral members due to the volatile component from the silicone cured product even in a case of being exposed to high temperatures equal to or higher than room temperature for a long time.

As the alcohol having 1 to 3 carbon atoms and the oxide thereof, and the alkyl group-containing silane compound having 1 to 3 carbon atoms, specifically, compounds similar to those described in the method of manufacturing the silicone cured product of the embodiment can be cited. In the silicone cured product of the embodiment, the total generation amount of the volatile component (Y) is preferably 8 ppm or less, and more preferably 1 ppm or less.

The silicone cured product of the embodiment can be manufactured by, for example, the above-described method of manufacturing the silicone cured product of the embodiment.

The silicone cured product obtained by the above-described method of manufacturing the silicone cured product of the embodiment has the sufficient rubber hardness, is good in the mechanical properties (strength and elongation), and is good in weather resistance. Further, it is unlikely to discolor, for example, yellow with time. Moreover, when the additional polyorganosiloxane composition, for example, the additional polyorganosiloxane composition (X), preferably, the additional polyorganosiloxane composition (X1), containing no inorganic filler, is used, this silicone cured product has a transmittance of 85% or more to light with a wavelength of 400 nm in a thickness of 6 mm, which is high light transmittance.

[Optical Member]

Since the silicone cured product of the embodiment of this embodiment has the above-described excellent properties, it can be used as an optical member. The silicone cured product of the embodiment is suitable as, for example, the optical member such as a sealing material of a light-emitting element in a light-emitting device such as an LED device or a material of a functional lens. In particular, the silicone cured product of the embodiment hardly causes an adverse influence such as haze of the optical member due to the volatile component gas even in a case of using for sealing use since the generation of the volatile component gas is significantly reduced.

As the optical member, suitable use is possible as a lens and a cover of various indoor or outdoor light sources and an automobile light source. As the light sources, there can be cited indoor or outdoor lighting, a reading light and accent lighting of public transportation facilities, an LED street light, and the like. According to the silicone cured product of this embodiment, since the volatile component gas generated due to heat from the light sources is reduced significantly, in a case of using as the lens for light source and the cover for light source, the contamination and the haze of the lens and cover can be suppressed over a long time.

As the optical member, more specifically, there can be exemplified a primary or secondary LED lens, a thick optical lens, an LED reflector, an automobile LED matrix lighting lens, an augmented reality optical member, an LED chip silicone optical head, work light lens and reflector, an illuminating optical member for smartphone or tablet, an LED display for computer or television, a light guide, and the like.

EXAMPLES

Hereinafter, this embodiment will be specifically described citing examples, but this embodiment is not limited to these examples.

In the following description, an M unit, an $M^{vi}$ unit, an $M^H$ unit, a D unit, a $D^H$ unit and a Q unit represent siloxane units represented by the following formulas, respectively, and an OE unit represents an organic unit represented by the following formula.

| | |
|---|---|
| $(CH_3)_3SiO_{1/2}$ | M unit |
| $(CH_3)_2(CH_2=CH)SiO_{1/2}$ | $M^{vi}$ unit |
| $(CH_3)_2HSiO_{1/2}$ | $M^H$ unit |
| $(CH_3)_2SiO_{2/2}$ | D unit |
| $(CH_3)HSiO_{2/2}$ | D unit |
| $Si_{4/2}$ | Q unit |
| $CH_2O_{1/2}$ | OE unit |

A viscosity is a viscosity measured at 25° C. in conformity with JIS K6249 by using a rotational viscometer unless otherwise stated. Further, a mass average molecular weight (Mw) is a value which is measured using a gel permeation chromatography (GPC) device (manufactured by Shimadzu Corporation, device name; Prominence GPC System, column; Shim-Pack GPC-80M) for which toluene is used as a solvent, and is converted into polystyrene. Moreover, a nonvolatile content (mass %) is a value measured under a heating condition of 150° C.×1 hour.

First, two types of resinoid vinyl group-containing methylpolysiloxanes as the component (A2) and a resinoid polymethylhydrogensiloxane and a straight-chain polymethylhydrogensiloxane as the component (B) were synthesized according to the following synthesis examples.

Synthesis Example 1 (Synthesis of Resinoid Vinyl Group-Containing Methylpolysiloxane A2-1)

970 g (4.66 mol) of tetraethoxysilane, 70 g (0.58 mol) of chlorodimethylvinylsilane, 335 g (3.09 mol) of chlorotrimethylsilane, and 400 g of xylene were put and stirred in a flask, and 900 g of a mixed solution of 600 g of water and 300 g of acetone was dropped therein. Hydrolysis was performed by stirring at 70 to 80° C. for 1 hour, thereafter performing liquid separation to obtain a xylene solution. Next, 50 g of water was added to the obtained xylene solution and water washing and liquid separation were performed to extract the acetone in the xylene solution into the water. Then, operations of the water washing and the liquid separation were repeated until the water used for the washing indicated neutrality.

Next, 200 g of xylene and 0.18 g of a potassium hydroxide were added to the obtained xylene solution, and stirring was performed while heating. Dehydration was performed by heating up to 140° C., thereafter performing reflux at 140° C. for 3 hours. After cooling, neutralization was performed using a phosphoric acid, and vinyl group-containing methylpolysiloxane as a nonvolatile content was adjusted so as to become 50 mass %, to obtain a xylene solution of a resinoid vinyl group-containing methylpolysiloxane A2-1.

Regarding the thus obtained resinoid vinyl group-containing methylpolysiloxane A2-1, a ratio of the number of hydrogen atoms derived from $CH_2$ groups in ethoxy groups and the number of hydrogen atoms derived from $CH_3$ groups bonded to silicon atoms (the number of hydrogen atoms derived from $CH_2$ groups/the number of hydrogen atoms derived from Si—$CH_3$ groups) was found by $^1$H-NMR, resulting in 0.0107. It was found from this that in the resinoid vinyl group-containing methylpolysiloxane A2-1, a molar ratio of alkoxy groups (ethoxy groups) to methyl groups bonded to the silicon atoms (Si—$CH_3$ groups)(hereinafter, referred to as OE/SiMe.) was 0.016.

Further, it is found from a charged amount of a starting material and a result of $^1$H-NMR that the obtained resinoid vinyl group-containing methylpolysiloxane A2-1 has $M^{vi}$ unit, M unit, Q unit, and OE unit and a molar ratio of the units is $M^{vi}$ unit:M unit:Q unit:OE unit=0.070:0.371:0.559:0.020. Mw of the resinoid vinyl group-containing methylpolysiloxane A2-1 found by GPC was 2830. Further, an average composition formula of the resinoid vinyl group-containing methylpolysiloxane A2-1 found from the aforesaid molar ratio and Mw was $W^{vi}_{2.8}M_{14.8}Q_{22.3}(OE)_{0.80}$ (a number indicated by a subscript on the right side of each of the units indicates an average number of each of the units in one molecule), and the number of alkenyl groups bonded to silicon atoms in one molecule was 2.8 on average.

Synthesis Example 2 (Synthesis of Resinoid Vinyl Group-Containing Methylpolysiloxane A2-2)

970 g (4.66 mol) of tetraethoxysilane, 70 g (0.58 mol) of chlorodimethylvinylsilane, 335 g (3.09 mol) of chlorotrimethylsilane, and 400 g of xylene were put and stirred in a flask, and 60 g of water was dropped therein. Hydrolysis was performed by stirring at 70 to 80° C. for 1 hour, thereafter performing liquid separation to obtain a xylene solution. Next, the obtained xylene solution was heated up to 130° C., thereby performing dehydration and dehydrochlorination. The aforesaid operations were continued until the xylene solution indicated neutrality.

Next, 200 g of xylene and 0.18 g of a potassium hydroxide were added to the xylene solution, and stirring was performed while heating. Heating was performed up to 140° C., thereafter performing reflux at 140° C. for 3 hours. After cooling, neutralization was performed using a phosphoric acid, and a nonvolatile content was adjusted so as to become 50 mass %, to obtain a xylene solution of a resinoid vinyl group-containing methylpolysiloxane A2-2.

In the thus obtained resinoid vinyl group-containing methylpolysiloxane A2-2, the number of hydrogen atoms derived from $CH_2$ groups/the number of hydrogen atoms derived from Si—CHs groups, found by $^1$H-NMR, was 0.0173. It was found from this that OE/SiMe in the resinoid vinyl group-containing methylpolysiloxane A2-2 was 0.026.

Further, it is found from a charged amount of a starting material and a result of $^1$H-NMR that the resinoid vinyl group-containing methylpolysiloxane A2-2 has $M^{vi}$ unit, M unit, Q unit, and OE unit and a molar ratio of the units is $M^{vi}$ unit:M unit:Q unit:OE unit=0.070:0.371:0.559:0.033. Mw of the resinoid vinyl group-containing methylpolysiloxane A2-2 found by GPC was 1890. Further, an average composition formula of the resinoid vinyl group-containing methylpolysiloxane A2-2 found from the aforesaid molar ratio and Mw was $M^{vi}_{1.9}M_{9.8}Q_{14.8}(OE)_{0.87}$ (a number indicated by a subscript on the right side of each of the units indicates an average number of each of the units in one molecule.), and the number of alkenyl groups bonded to silicon atoms in one molecule was 1.9 on average.

Synthesis Example 3 (Synthesis of Resinoid Polymethylhydrogensiloxane B)

500 g of toluene, 830 g (4.0 mol) of tetraethoxysilane, and 760 g (8.0 mol) of dimethylchlorosilane were charged and uniformly dissolved. This was dropped in excessive water put in a reaction container equipped with an agitator, a dropping device, a heating and cooling device, and a pressure reducing device while stirred, and cohydrolysis and condensation were performed at room temperature while heat of solution of a hydrochloric acid made as a byproduct was being removed by cooling. After washing an obtained organic phase by using water until washing water indicated neutrality and dehydrating it, the toluene and a tetramethyldisiloxane made as a byproduct were distilled off at 100° C./667 Pa (5 mmHg) and moreover heated at 150° C./667 Pa (5 mmHg) to thereby remove a low-molecular weight substance, to obtain a liquid resinoid polymethylhydrogensiloxane B1.

It was found from each unit ratio ($M^H$:Q=2:1) found by measurement of $^{29}$Si-NMR and Mw of 775 found by GPC that the obtained resinoid polymethylhydrogensiloxane B1 was a resinoid polymethylhydrogensiloxane represented by a formula: $M^H_8Q_4$ (12 silicon atoms). A content ratio of Si—H in this polymethylhydrogensiloxane B1 was 10.0 mmol/g.

Further, regarding the resinoid polymethylhydrogensiloxane B1, a molar ratio of an ethoxy group to a hydrogen atom (Si—H) found by $^1$H-NMR (OE/Si—H) was 0.03.

A mass reduction rate of the mass after heating (Wa) from the mass before heating (Wb) (a loss on heating; (Wb−Wa)/Wb×100, Wb, Wa are masses at 25° C.), caused by heating the obtained resinoid polymethylhydrogensiloxane B1 at 150° C. for 30 minutes, was 15%. Note that the measurement of the mass reduction rate was performed by leaving a sample with about 2 g in a dryer set at 150° C. The measurement of a loss on heating of the below described polymethylhydrogensiloxane B2 is also similar.

Ltd, apparatus name: TYPE 2-03 WIPRENE), 500 g of the reaction solution after the heating and stirring was distilled under reduced pressure at 130° C. while spending about 10 hours, to remove a low-molecular weight substance having a low boiling point.

It is found from a charged amount of a starting material that a thus obtained straight-chain polymethylhydrogensiloxane B2 is represented by an average formula: $MD^H_{23}D_{20}M$ (45 silicon atoms, Mw3020). A content ratio of Si—H in the straight-chain polymethylhydrogensiloxane B2 was 7.3 mmol/g. Further, the loss on heating of the obtained straight-chain polymethylhydrogensiloxane B2 was 0.1%. Note that the straight-chain polymethylhydrogensiloxane B2 was subjected to $^1$H-NMR analysis, but an alkoxy group having 1 to 3 carbon atoms was not detected.

[Component (A1)]

As an component (A1), straight-chain dimethylpolysiloxanes A1-1 (a viscosity of 80 Pa·s, a loss on heating of 1.5%) and A1-2 (a viscosity of 10 Pa·s, a loss on heating of 0.1%) in each of which both ends of a molecular chain were terminated with dimethylvinylsiloxy groups were prepared. These polymers were subjected to $^1$H-NMR analysis, but an alkoxy group having 1 to 3 carbon atoms was not detected in either of them. Note that the losses on heating of the straight-chain dimethylpolysiloxanes A1-1 and the straight-chain dimethylpolysiloxanes A1-2 are the values measured in a similar manner except that a heating condition is changed from heating at 150° C. for 30 minutes to heating at 200° C. for 4 hours in the measurement of the loss on heating in the resinoid polymethylhydrogensiloxane B1. Table 1 shows physical properties of the component (A1) and the above synthesized polymers.

TABLE 1

| Component | Polymer | Viscosity or Mw | The number of Vi groups or Si—H content ratio | Loss on heating | OE/Si—Me or OE/Si—H |
|---|---|---|---|---|---|
| (A1) | (A1-1) Both ends dimethylvinylsiloxy group-terminated straight-chain dimethylpolysiloxane | Viscosity 80 Pa·s | The number of Vi groups; 2 pieces | 1.5% (200° C., 4 hr) | — |
| | (A1-2) Both ends dimethylvinylsiloxy group-terminated straight-chain dimethylpolysiloxane | Viscosity 10 Pa·s | The number of Vi groups; 2 pieces | 0.1% (200° C., 4 hr) | — |
| (A2) | (A2-1) Resinoid vinyl group-containing methylpolysiloxane | Mw 2830 | The number of Vi groups; 2.8 pieces | — | OE/Si—Me; 0.016 |
| | (A2-2) Resinoid vinyl group-containing methylpolysiloxane | Mw 1890 | The number of Vi groups; 1.9 pieces | — | OE/Si—Me; 0.026 |
| (B) | (B1) Resinoid polymethylhydrogensiloxane | Mw 775 | Si—H content ratio 10.0 mmol/g | 15% (150° C., 30 min) | OE/Si—H; 0.03 |
| | (B2) Straight-chain polymethylhydrogensiloxane | Mw 775 | Si—H content ratio 7.3 mmol/g | 0.1% (150° C., 30 min) | — |

Synthesis Example 4 (Synthesis of Straight-Chain Polymethylhydrogensiloxane B2)

1390 g (0.44 mol) of a polymethylhydrogensiloxane represented by an average formula: $MD^H_{50}M$, 1406 g (4.75 mol) of an octamethylcyclotetrasiloxane, and 83 g (0.51 mol) of a hexamethyldisiloxane were put and stirred in a flask together with 25 g of activated clay, and an equilibration reaction was performed at 50 to 70° C. for 6 hours.

Next, after removing the activated clay by filtrating a reaction solution, a temperature was made to rise to 140° C. under a reduced pressure of 5 mmHg or less, thereafter preforming heating and stirring at 140 to 150° C. under the reduced pressure for 6 hours. Next, thin-film distillation was further performed. That is, by using the film distillation apparatus (manufactured by Kobelco Eco-Solutions Co., Example 1

65 parts by mass (hereinafter, simply indicated as parts.) of a straight-chain dimethylpolysiloxane A1-1 (a viscosity of 80 Pa·s, a loss on heating of 1.5 mass %) in which both ends of a molecular chain were terminated with dimethylvinylsiloxy groups and 70 parts of a xylene solution (50 mass %) of the resinoid methylpolysiloxane A2-2 (Mw 1890, the number of vinyl groups of 1.9 on average in one molecule, OE/SiMe=0.026) obtained in Synthesis example 2 were mixed together (a mass ratio of a mixture is (A1-1):(A2-2)=65:35 by nonvolatile content), and heated to 150° C. under a reduced pressure condition to remove xylene.

Next, 100 parts of an obtained vinyl group-containing polymer mixture (A), 7.4 parts (a molar ratio of Si—H in the methylhydrogenpolysiloxane B1 to vinyl groups in the vinyl group-containing polymer mixture (A) (Si—H/Vi)=2.0) of the resinoid methylhydrogenpolysiloxane B1 obtained in Synthesis example 3 and represented by the average formula: $M^H{}_8Q_4$, and an amount in which a (C) platinum complex solution having a tetramethyltetravinylcyclotetrasiloxane as a ligand became 3 ppm of the whole of a composition as a Pt content were mixed with one another, to prepare an additional polyorganosiloxane composition (X1). Table 2 shows compositions of the additional polyorganosiloxane composition (X1). Table 2 shows OE/SiMe in the component (A) together.

The above obtained additional polyorganosiloxane composition (X1) was heated in a metal mold (200 mm×200 mm 2 mm) under closed atmosphere at 150° C. for 15 minutes. The additional polyorganosiloxane composition (X1) was cured by hydrosilylation reaction in such a manner as above to obtain a primary cured product of the additional polyorganosiloxane composition (X1)(curing step).

Next, the primary cured product was taken out of the metal mold, and the heating at 150° C. for 4 hours (heating step) was performed on the primary cured product as an opening condition, namely, as a condition of an atmosphere at normal pressure (760 mmHg) to obtain a silicone cured product.

The measurement of a total generation amount of a volatile component (Y) was performed on the above obtained primary cured product and silicone cured product as follows. A haze test (measurement of a gross decreasing rate) was performed. A total generation amount of the volatile component (Y) of the primary cured product was 16 ppm. Table 2 shows a total generation amount of the volatile component (Y) and a measurement result of the haze test (the measurement of the gross decreasing rate) of the silicone cured product, at the bottom thereof.

[Total Generation Amount of Volatile Component (Y)]

2.5 g of the silicone cured product was housed in an airtight container made of glass and having an internal volume of 22 mL, and held together with the container at 150° C. for 16 hours. Thereafter, a gas in the airtight container was gathered and analyzed by gas chromatography mass spectroscopy (GC/MS). For a column, HP-5 ms (30 m in length×250 μm in inside diameter×0.25 μm in film thickness, manufactured by Agilent Technologies Inc.) was used. From an analysis result of the GC/MS, after calculating a total amount of an alcohol having 1 to 3 carbon atoms and an oxide thereof, and an alkyl group-containing silane compound having 1 to 3 carbon atoms, specifically, methanol, ethanol, isopropanol, acetic acid, trimethylsilane, tetramethylsilane, trimethylsilanol, trimethylethoxysilane, and trimethylsilane acetate, a mass concentration (ppm) of these compounds per unit mass of the silicone cured product was found to be set as a total generation amount of the volatile component (Y).

[Haze Test (Gross Decreasing Rate)]

15 g of the above obtained silicone cured product was housed in a tall beaker with an internal volume of 250 mL, which was sealed by covering the top of the tall beaker with a glass plate. A heating test in which the tall beaker was heated by a heater from the outside at 130° C. for 4 hours while cooling the glass plate with a cooling plate placed on the glass plate was performed. After the heating test, the glass plate was removed to measure glossiness of the glass plate as follows. The glossiness was measured at an incident angle of 60° with a vertical incidence to the glass plate set to 0°. For the measurement of the glossiness, micro-TRI-gloss manufactured by BYK-Gardner GmbH was used.

From a glossiness of the glass plate before the heating test (Gb) and a glossiness of the glass plate after the heating test using the silicone cured product (Ga), a decreasing rate of the glossiness according to the heating test (gloss decreasing rate; (Gb−Ga)/Gb×100[%]) was calculated.

Examples 2 to 71

The straight-chain dimethylpolysiloxanes A1-1 or A1-2 (a viscosity of 10 Pa·s, a loss on heating of 0.1 mass %) in each of which both ends were terminated with dimethylvinylsiloxy groups as the component (A1), the resinoid methylpolysiloxanes A2-1 obtained in Synthesis example 1 or the resinoid methylpolysiloxane A2-2 obtained in Synthesis example 2 as the component (A2), the resinoid polymethylhydrogensiloxane B1 obtained in Synthesis example 3 or the straight-chain polymethylhydrogensiloxanes B2 obtained in Synthesis example 4 as the component (B), and the (C) platinum complex solution having a tetramethyltetravinylcyclotetrasiloxane as a ligand were compounded at each of the ratios showed in Table 2 and mixed together similarly to Example 1 to prepare additional polyorganosiloxane compositions (X1).

The obtained additional polyorganosiloxane compositions (X) were cured by the hydrosilylation reaction under the temperature conditions and during the times in Table 2 each under closed atmosphere in the metal mold using the metal mold similar to that in Example 1, to obtain primary cured products of the additional polyorganosiloxane compositions (X1)(curing step).

Next, the primary cured products were each taken out of the metal mold, and on the primary cured products, under the conditions showed in Table 2, a heating step under an opening condition or under reduced pressure, or, a solvent contact step and a heating step under reduced pressure were performed, to obtain silicone cured products. Note that regarding Example 4, in the curing step, high-temperature heat treatment at 200° C. for 4 hours was performed after curing by the hydrosilylation reaction.

Further, in Examples 2, 4, after the curing step, before the heating step, the solvent contact step of immersing 10 g of each of the primary cured products in hexane (25° C.) of 500 mL for 24 hours was performed. Moreover, regarding Examples 2, 4 to 6, an atmosphere was set under a condition of reduced pressure (3 mmHg) by using a vacuum pump at the time of heating.

The measurement of a total generation amount of a volatile component (Y) and the haze test (measurement of a gross decreasing rate) were performed on each of the obtained silicone cured products similarly to the above. Table 2 shows results at the bottom thereof.

TABLE 2

| | | | | | Example 1 | Example 2 | Example 3 | Example 4 |
|---|---|---|---|---|---|---|---|---|
| Composition | Component (A) (part by mass) | (A1) | (A1-1) Both ends dimethylvinylsiloxy group-terminated straight-chain dimethylpolysiloxane | | 65 | | 60 | |
| | | | (A1-2) Both ends dimethylvinylsiloxy group-terminated straight-chain dimethylpolysiloxane | | | 95 | | 90 |
| | | (A2) | (A2-1) Resinoid vinyl group-containing methylpolysiloxane | | | 5 | 40 | 10 |
| | | | (A2-2) Resinoid vinyl group-containing methylpolysiloxane | | 35 | | | |
| | | OE/SiMe in component (A) | | | 0.009 | 0.001 | 0.006 | 0.002 |
| | Component (B) (part by mass) | (B1) Resinoid polymethylhydrogensiloxane | | | 7.4 | | 8.4 | |
| | | (B2) Straight-chain polymethylhydrogensiloxane | | | | 2.4 | | 3.6 |
| | (C) Platinum-based metal compound (as Pt amount) | | | | 3 ppm | 3 ppm | 3 ppm | 3 ppm |
| | Si—H/Vi | | | | 2.0 | 1.8 | 2.0 | 1.8 |
| Manufacturing method | Curing step | Hydrosilyl reaction (curing) condition | | | 150° C., 15 min. | 150° C., 15 min. | 150° C., 15 min. | 150° C., 15 min. |
| | | High-temperature heat treatment condition | | | — | — | — | 200° C., 4 hours |
| | | Solvent contact step | | | — | Hexane extraction | — | Hexane extraction |
| | Heating step | Temperature [° C.] | | | 150 | 130 | 150 | 130 |
| | | Time [hour] | | | 4 | 12 | 4 | 12 |
| | | Pressure [mmHg] | | | Normal pressure | 3 mmHg | Normal pressure | 3 mmHg |
| Evaluation | Total generation amount (ppm) of volatile component (Y) | | | | 8 | <0.1 | 6 | 4 |
| | Gross decreasing rate (%) | | | | 1.0 | <0.1 | 0.7 | 0.6 |

| | | | | | Example 5 | Example 6 |
|---|---|---|---|---|---|---|
| Composition | Component (A) (part by mass) | (A1) | (A1-1) Both ends dimethylvinylsiloxy group-terminated straight-chain dimethylpolysiloxane | | | |
| | | | (A1-2) Both ends dimethylvinylsiloxy group-terminated straight-chain dimethylpolysiloxane | | 90 | 75 |
| | | (A2) | (A2-1) Resinoid vinyl group-containing methylpolysiloxane | | 10 | 25 |
| | | | (A2-2) Resinoid vinyl group-containing methylpolysiloxane | | | |
| | | OE/SiMe in component (A) | | | 0.002 | 0.004 |
| | Component (B) (part by mass) | (B1) Resinoid polymethylhydrogensiloxane | | | | |
| | | (B2) Straight-chain polymethylhydrogensiloxane | | | 3.6 | 7.1 |
| | (C) Platinum-based metal compound (as Pt amount) | | | | 3 ppm | 3 ppm |
| | Si—H/Vi | | | | 1.8 | 1.8 |
| Manufacturing method | Curing step | Hydrosilyl reaction (curing) condition | | | 150° C., 15 min. | 150° C., 15 min. |
| | | High-temperature heat treatment condition | | | — | — |
| | | Solvent contact step | | | — | — |
| | Heating step | Temperature [° C.] | | | 130 | 130 |
| | | Time [hour] | | | 12 | 12 |
| | | Pressure [mmHg] | | | 3 mmHg | 3 mmHg |
| Evaluation | Total generation amount (ppm) of volatile component (Y) | | | | 0.3 | 5 |
| | Gross decreasing rate (%) | | | | <0.1 | 0.6 |

Comparative Examples 1 to 6

The straight-chain dimethylpolysiloxanes A1-1 or A1-2 in each of which both ends were terminated with dimethylvinylsiloxy groups as the component (A1), the resinoid methylpolysiloxanes A2-1 or A2-2 as the component (A2), the polymethylhydrogensiloxanes B1 or B2 as the component (B), and the (C) platinum complex solution having a tetramethyltetravinylcyclotetrasiloxane as a ligand were compounded at each of the ratios showed in Table 3 and mixed together similarly to Example 1 to prepare additional polyorganosiloxane compositions (X1).

The obtained additional polyorganosiloxane compositions (X1) were cured by the hydrosilylation reaction under the temperature conditions and during the times in Table 3 each under closed atmosphere in the metal mold using the metal mold similar to that in Example 1 and further subjected to the high-temperature heat treatment under the conditions showed in Table 3, to obtain primary cured products of the additional polyorganosiloxane compositions (X1).

In Comparative examples 1 to 6, neither the solvent contact step nor the heating step in the method of manufacturing the silicone cured product of the embodiment was performed.

The measurement of a total generation amount of a volatile component (Y) and the haze test (measurement of a gross decreasing rate) were performed on each of the silicone cured products in Comparative examples which were the primary cured products similarly to the above. Table 3 shows results at the bottom thereof.

TABLE 3

| | | | | Comparative Example 1 | Comparative Example 2 | Comparative Example 3 |
|---|---|---|---|---|---|---|
| Composition | Component (A) (part by mass) | (A1) | (A1-1) Both ends dimethylvinylsiloxy group-terminated straight-chain dimethylpolysiloxane | 65 | 65 | 60 |
| | | | (A1-2) Both ends dimethylvinylsiloxy group-terminated straight-chain dimethylpolysiloxane | | | |
| | | (A2) | (A2-1) Resinoid vinyl group-containing methylpolysiloxane | | | 40 |
| | | | (A2-2) Resinoid vinyl group-containing methylpolysiloxane | 35 | 35 | |
| | | OE/SiMe in component (A) | | 0.009 | 0.009 | 0.006 |
| | Component (B) (part by mass) | (B1) Resinoid polymethylhydrogensiloxane | | 7.4 | 7.4 | 8.4 |
| | | (B2) Straight-chain polymethylhydrogensiloxane | | | | |
| | (C) Platinum-based metal compound (as Pt amount) | | | 3 ppm | 3 ppm | 3 ppm |
| | Si—H/Vi | | | 2.0 | 2.0 | 2.0 |
| Manufacturing method | Curing step | Hydrosilyl reaction (curing) condition | | 150° C., 15 min. | 150° C., 15 min. | 150° C., 15 min. |
| | | High-temperature heat treatment condition | | 200° C., 4 hours | 200° C., 12 hours | 200° C., 4 hours |
| | | Solvent contact step | | — | — | — |
| | | Heating step | | — | — | — |
| Evaluation | Total generation at amount (ppm) of volatile component (Y) | | | 19 | 61 | 73 |
| | Gross decreasing rate (%) | | | 2.6 | 3.0 | 4.4 |

| | | | | Comparative Example 4 | Comparative Example 5 | Comparative Example 6 |
|---|---|---|---|---|---|---|
| Composition | Component (A) (part mass) | (A1) | (A1-1) Both ends dimethylvinylsiloxy group-terminated straight-chain dimethylpolysiloxane | 60 | | 65 |
| | | | (A1-2) Both ends dimethylvinylsiloxy group-terminated straight-chain dimethylpolysiloxane | | 70 | |
| | | (A2) | (A2-1) Resinoid vinyl group-containing methylpolysiloxane | 40 | 30 | |
| | | | (A2-2) Resinoid vinyl group-containing methylpolysiloxane | | | 35 |
| | | OE/SiMe in component (A) | | 0.006 | 0.005 | 0.009 |
| | Component (B) (part by mass) | (B1) Resinoid polymethylhydrogensiloxane | | | 6.0 | 7.4 |
| | | (B2) Straight-chain polymethylhydrogensiloxane | | 10.3 | | |
| | (C) Platinum-based metal compound (as Pt amount) | | | 3 ppm | 3 ppm | 3 ppm |
| | Si—H/Vi | | | 1.8 | 1.8 | 2.0 |

TABLE 3-continued

| Manufacturing method | Curing step | Hydrosilyl reaction (curing) condition | 150° C., 15 min. | 150° C., 15 min. | 150° C., 15 min. |
|---|---|---|---|---|---|
| | | High-temperature heat treatment condition | 200° C., 4 hours | 200° C., 4 hours | 180° C., 4 hours |
| | | Solvent contact step | — | — | — |
| | | Heating step | — | — | — |
| Evaluation | | Total generation at amount (ppm) of volatile component (Y) | 61 | 25 | 16 |
| | | Gross decreasing rate (%) | 3.1 | 2.7 | 2.5 |

It is found from Tables 2, 3 that in each of the silicone cured products in Examples 1 to 6 in which the primary cured products obtained by curing the additional polyorganosiloxane compositions (X1) under closed atmosphere at a temperature of not lower than 40° C. nor higher than 200° C. are heated under open atmosphere or reduced pressure at 60° C. to 160'C, a generation amount of an alcohol having 1 to 3 carbon atoms and an oxide thereof, and an alkyl group-containing silane compound having 1 to 3 carbon atoms (a total generation amount of the volatile component (Y)) under predetermined conditions is reduced significantly as compared with the silicone cured products in Comparative examples (the primary cured products of the additional polyorganosiloxane compositions (X1)). Further, also in the haze test, it is found that the gloss decreasing rate of the glass plate is small and in a case of using for sealing use, the haze due to a gas of the volatile component is suppressed.

What is claimed is:

1. A method of manufacturing a silicone cured product comprising:
   curing a polyorganosiloxane composition by a hydrosilylation reaction under closed atmosphere at a temperature of not lower than 40° C. nor higher than 200° ° C. to obtain a primary cured product, the polyorganosiloxane composition having an alkoxy group having 1 to 3 carbon atoms; and
   heating the primary cured product under a reduced pressure of 10 mmHg or less at a temperature of not lower than 60° C. nor higher than 160° C. to remove an alcohol having 1 to 3 carbon atoms and an oxide thereof, and an alkyl group-containing silane compound having 1 to 3 carbon atoms.

2. The method of manufacturing the silicone cured product according to claim 1, having no high-temperature heating exceeding 160° ° C. after the heating the primary cured produce to remove the alcohol having 1 to 3 carbon atoms and the oxide thereof.

3. The method of manufacturing the silicone cured product according to claim 1, further comprising bringing the primary cured product into contact with a solvent after the curing.

4. The method of manufacturing the silicone cured product according to claim 1, wherein the polyorganosiloxane composition comprises:
   (A) a polyorganosiloxane mixture composed of 50 to 100 mass % of (A1) a straight-chain polyorganosiloxane having two or more alkenyl groups on average in one molecule and 50 to 0 mass % of (A2) a resinoid polyorganosiloxane having 1.5 or more alkenyl groups on average in one molecule, the (A1) straight-chain polyorganosiloxane and the (A2) resinoid polyorganosiloxane together making up 100 mass % of the (A) polyorganosiloxane mixture;
   (B) a polyorganohydrogensiloxane containing 5 mmol/g or more of a hydrogen atom bonded to a silicon atom in an amount in which a molar ratio of the hydrogen atom bonded to the silicon atom to the alkenyl group of the component (A) (the number of moles of the hydrogen atom bonded to the silicon atom/the number of moles of the alkenyl group) is 1.0 to 3.0; and
   (C) a hydrosilylation reaction catalyst, and
   wherein at least one of the (A) polyorganosiloxane mixture and the (B) polyorganohydrogensiloxane has an alkoxy group having 1 to 3 carbon atoms.

5. The method of manufacturing the silicone cured product according to claim 4, wherein the (A) polyorganosiloxane mixture has a hydrocarbon group other than the alkenyl group and an alkoxy group having 1 to 3 carbon atoms, and a molar ratio of the alkoxy group having 1 to 3 carbon atoms to the hydrocarbon group other than the alkenyl group in the (A) polyorganosiloxane mixture (the number of moles of the alkoxy group having 1 to 3 carbon atoms/the number of moles of the hydrocarbon group other than the alkenyl group) is not less than 0.001 nor more than 0.025.

6. The method of manufacturing the silicone cured product according to claim 4,
   wherein the (A2) resinoid polyorganosiloxane is, in siloxane units, composed of a monofunctional siloxane unit represented by a formula 1: $R^4_3SiO_{1/2}$, a monofunctional siloxane unit represented by a formula 2: $R^4_2R^5SiO_{1/2}$, and a tetrafunctional siloxane unit represented by a formula 4: $SiO_{4/2}$, and $R^4$ is an unsubstituted alkyl group, and a plurality of $R^4$s may be different from each other in the formulas 1, 2, and $R^5$ is an alkenyl group in the formula 2 and the number of alkenyl groups present in one molecule of the (A2) is 1.5 or more on average, and
   has an alkoxy group having 1 to 3 carbon atoms bonded to a silicon atom, and
   wherein a molar ratio of the alkoxy group having 1 to 3 carbon atoms to the unsubstituted alkyl group in the (A2) resinoid polyorganosiloxane (the number of moles of the alkoxy group having 1 to 3 carbon atoms/the number of moles of the unsubstituted alkyl group) is not less than 0.005 nor more than 0.030.

7. The method of manufacturing the silicone cured product according to claim 4,
   wherein the (B) polyorganohydrogensiloxane has an alkoxy group having 1 to 3 carbon atoms, and
   wherein a molar ratio of the alkoxy group having 1 to 3 carbon atoms to the hydrogen atom bonded to the silicon atom in the (B) polyorganohydrogensiloxane is not less than 0.01 nor more than 0.15.

8. A cured silicone product in which when heated at 150° C. for 16 hours, a total generation amount of an alcohol having 1 to 3 carbon atoms and an oxide thereof, and an alkyl group-containing silane compound having 1 to 3 carbon atoms, is 5 ppm or less, wherein the silicone is cured by an addition reaction.

9. A silicone cured product in which when heated at 150° C. for 16 hours, a total generation amount of an alcohol having 1 to 3 carbon atoms and an oxide thereof, and an alkyl group-containing silane compound having 1 to 3 carbon atoms is 10 ppm or less, being obtained by the method according to claim 1.

10. An optical member composed of the silicone cured product according to claim 8.

11. The optical member according to claim 10 being a light source lens or a light source cover.

12. The optical member according to claim 11, wherein the light source is at least one type selected from indoor or outdoor lighting, a reading light and accent lighting of public transportation facilities, and an LED street light.

13. The optical member according to claim 10 being at least one type selected from a primary or secondary LED lens, a thick optical lens, an LED reflector, an automobile LED matrix lighting lens, an augmented reality optical member, an LED chip silicone optical head, work light lens and reflector, an illuminating optical member for smartphone or tablet, an LED display for computer or television, and a light guide.

* * * * *